US008975097B2

(12) United States Patent
Watanabe et al.

(10) Patent No.: US 8,975,097 B2
(45) Date of Patent: Mar. 10, 2015

(54) METHOD OF MANUFACTURING LIQUID DISCHARGE HEAD

(71) Applicant: Canon Kabushiki Kaisha, Tokyo (JP)

(72) Inventors: Masahisa Watanabe, Yokohama (JP); Kenji Fujii, Yokohama (JP); Keisuke Kishimoto, Yokohama (JP); Ryotaro Murakami, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/288,206

(22) Filed: May 27, 2014

(65) Prior Publication Data

US 2015/0004724 A1 Jan. 1, 2015

(30) Foreign Application Priority Data

Jun. 28, 2013 (JP) ................................ 2013-136151

(51) Int. Cl.
*H01L 21/00* (2006.01)
*B41J 2/16* (2006.01)

(52) U.S. Cl.
CPC .................................... *B41J 2/1648* (2013.01)
USPC ..................... 438/21; 438/462; 257/E21.023

(58) Field of Classification Search
USPC .................................................. 257/E21.246
See application file for complete search history.

(56) References Cited

U.S. PATENT DOCUMENTS

2012/0329181 A1* 12/2012 Murakami et al. ............. 438/21

FOREIGN PATENT DOCUMENTS

JP 2002-25948 A 1/2002
JP 2010-162874 A 7/2010

* cited by examiner

*Primary Examiner* — Cheung Lee
(74) *Attorney, Agent, or Firm* — Canon USA Inc. IP Division

(57) ABSTRACT

A method of manufacturing a liquid discharge head includes: forming a first hole which penetrates through a wafer and becomes at least part of a liquid supply port and a second hole which does not penetrate through the wafer and becomes at least part of a cut-off portion from a front side of the wafer; arranging a dry film on the front side of the wafer; forming a flow passage forming member by heating and developing the dry film; and cutting off the liquid discharge head from the wafer by grinding the wafer from a back side so that the second hole penetrates through the wafer.

9 Claims, 3 Drawing Sheets

9
7a
7

12b
12a
12

14
13
7b 15
4c
4a
4b
14
13

11a
11b 11b
11
8
10
14
13

METHOD OF MANUFACTURING LIQUID DISCHARGE HEAD

BACKGROUND OF THE INVENTION

1. Field of the Invention

This disclosure relates to a method of manufacturing a liquid discharge head.

2. Description of the Related Art

A liquid discharge head is used for a liquid discharge apparatus such as an ink jet recording apparatus, and includes a flow passage forming member and a substrate. The flow passage forming member is provided on the substrate, has a liquid flow passage formed therein and, in some cases, has a liquid discharge port. The substrate has a liquid supply port, and liquid supplied from the liquid supply port to the flow passage is discharged from the liquid discharge port and lands on a recording medium such as paper.

In general, such liquid discharge head (chip) as described above is manufactured in such a manner that a plurality of liquid discharge heads are manufactured simultaneously on one piece of wafer, and the wafer is cut off along a cut-off portion into small pieces of liquid discharge heads.

Japanese Patent Laid-Open No. 2010-162874 describes a procedure of forming a liquid supply port and a cut-off portion in the wafer by forming flow passage forming members on a front side of a wafer (substrate) and etching the wafer from a back side.

Japanese Patent Laid-Open No. 2002-25948 describes a procedure of forming a cut-off portion with holes by forming members on a front side of a wafer, forming a non-penetrating hole in the wafer between the members, and penetrating the non-penetrating hole by grinding the wafer from a back side.

SUMMARY OF THE INVENTION

According to the disclosure, a method of manufacturing a liquid discharge head is provided. The liquid discharge head includes a substrate having a liquid supply port and a flow passage forming member on a front side of the substrate and is configured to be manufactured by being cut off from a wafer at a cut-off portion. The method includes: forming a first hole which penetrates through a wafer and becomes at least part of the liquid supply port and a second hole which does not penetrate through the wafer and becomes at least part of the cut-off portion in the wafer from a front side of the wafer; arranging a dry film on the front side of the wafer so as to close the first hole and the second hole on the front side; forming the flow passage forming member from the dry film by heating and developing the dry film in a state in which the first hole penetrates through the wafer; and cutting off the liquid discharge head from the wafer by grinding the wafer from a back side which is a side opposite to the front side so that the second hole penetrates through the wafer.

Further features of the present invention will become apparent from the following description of exemplary embodiments with reference to the attached drawings.

DESCRIPTION OF THE EMBODIMENTS

According to the method described in Japanese Patent Laid-Open No. 2010-162874, since a process (etching) of causing the wafer to be penetrated from the front surface to the back surface is performed after the formation of the flow passage forming member, it takes a long time to process the wafer, and hence it is necessary to sufficiently protect the flow passage forming member. Therefore, longer manufacturing time and higher costs are required correspondingly. According to the method disclosed in Japanese Patent Laid-Open No. 2002-25948, since the holes are formed through the wafer between the members, high degree of accuracy is required in formation of the members and a high technology is required for forming holes. Furthermore, when forming the holes for the cut-off portion and the liquid supply port simultaneously, a higher technology is required for the formation of the members and the holes.

In order to solve the above-described problems, a method of forming holes for the liquid supply port and the cut-off portion from the front side of the wafer, and forming the flow passage forming member on the front side after the formation of the holes is conceivable. In this case, although the holes may be filled with a material in order to prevent the flow passage forming member from dropping into the formed holes, the filled material needs to be removed later. Therefore, it is preferable to arrange a dry film for closing the holes in order to prevent the flow passage forming member from dropping into the holes instead of filling the holes with the material, and utilize the dry film as a flow passage forming member. The dry film arranged thereon has a flow passage and a discharge port formed by, for example, a photolithography process.

Figure 4A:
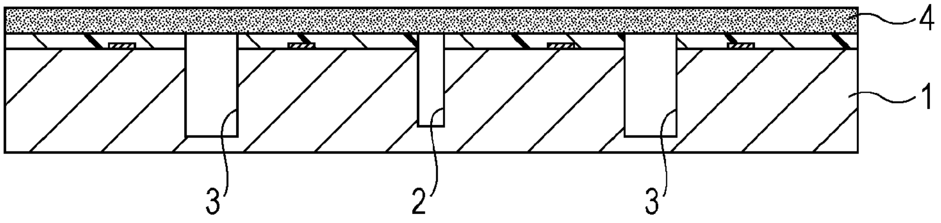
FIGS. 4A and 4B are drawings illustrating an example of the method of manufacturing the liquid discharge head.
Figure 4B:
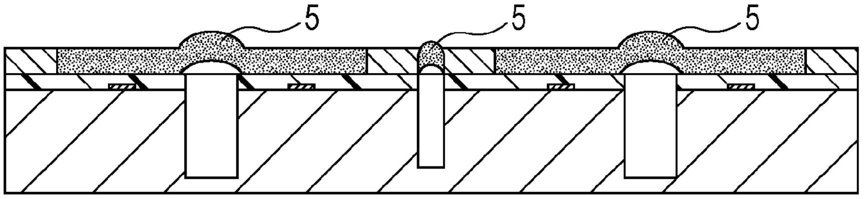

However, according to the study of the inventors of this disclosure, it is found that when heating is performed in a post exposure bake (PEB) process after the exposure in the photolithography process, air in the hole (cavity portion), which is sealed by the dry film, expands and hence affects the shape of the flow passage forming member. This phenomenon will be described with reference to FIGS. 4A and 4B. First, as illustrated in FIG. 4A, a hole 2 and a hole 3 are formed from a front side of a wafer 1, and a dry film 4 is arranged so as to close the holes. The hole 2 becomes at least part of the cut-off portion, and the hole 3 becomes at least part of the liquid supply port. The hole 2 and the hole 3 form the sealed spaces by the arrangement of the dry film. Subsequently, when the PEB process is performed, parts of the dry film on the sealed spaces are deformed by the air expanded in the sealed spaces, whereby deformed portions 5 are formed in the dry film 4. In particular, since the deformed portion on the hole 3 serves as parts of the flow passage, the shape of the flow passage forming member is deformed as a consequence. The heating process may also be needed in processes other than the photolithography process, and the heating process may cause deformation as described above.

Accordingly, this disclosure aims to form a flow passage forming member with high degree of accuracy even in the case of forming the hole for the supply port and the hole for the cut-off portion from the front side of the wafer, then forming the flow passage forming member on the front side of the wafer by using a dry film, and heating and developing the wafer.

Figure 1:
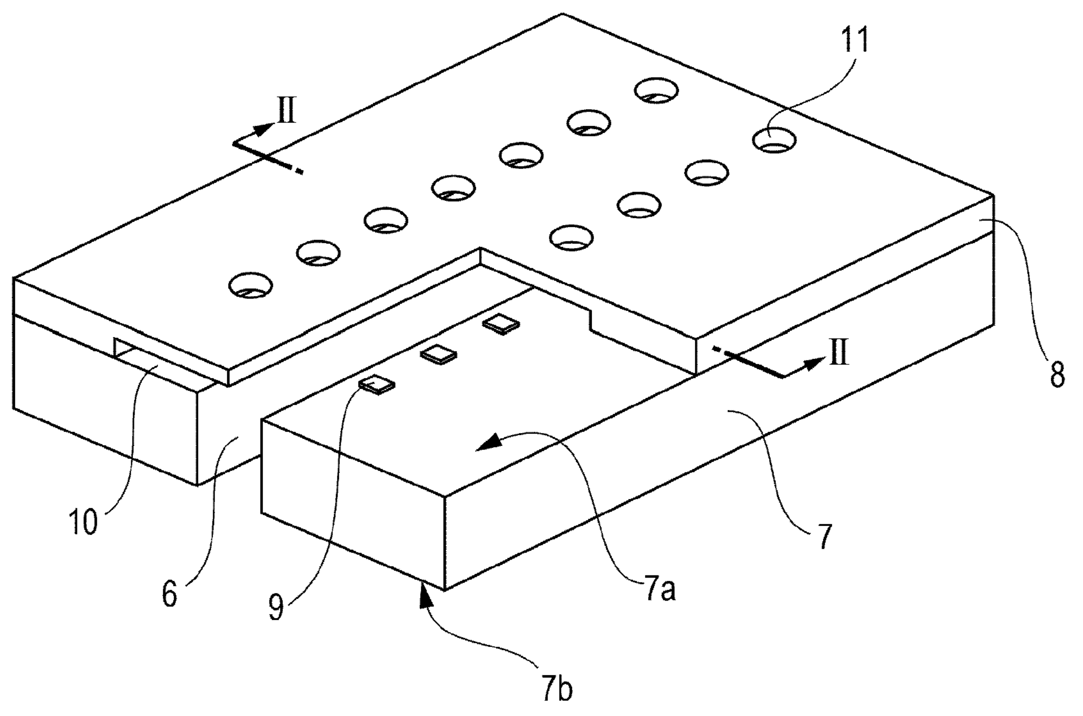
FIG. 1 is a drawing illustrating an example of a liquid discharge head manufactured in accordance with this disclosure.

Embodiments of this disclosure will be described below. FIG. 1 is a drawing illustrating an example of a liquid discharge head manufactured in accordance with this disclosure. The liquid discharge head includes a substrate 7 having a liquid supply port 6 and a flow passage forming member 8. The flow passage forming member 8 is formed on a front surface 7*a* side of the substrate 7. The liquid supply port 6 penetrates through the substrate from the front surface 7*a* to a back surface 7*b*, which is a surface opposite to the front surface. The substrate 7 is cut off from one piece of wafer into individual substrates. The substrate 7 includes an energy-generating element 9. Examples of the energy-generating element 9 include an electrothermal conversion element and a piezoelectric transducer. A control signal input electrode configured to drive an energy-generating element is electrically connected to the energy-generating element 9. The flow passage forming member 8 is formed on the front side of the substrate 7 and the flow passage forming member 8 forms a liquid flow passage 10. The flow passage forming member 8 also forms a liquid discharge port 11. Liquid supplied from the liquid supply port 6 to the flow passage 10 receives energy from the energy-generating element 9, and is discharged from the liquid discharge port 11.

A method of manufacturing the liquid discharge head will be described with reference to FIGS. 2A to 2G. FIGS. 2A to 2G are drawings illustrating cross-sectional views of a wafer including a II-II cross section of the liquid discharge head in FIG. 1.

Figures 2A, 2B, 2C, 2D, 2E, 2F, 2G:
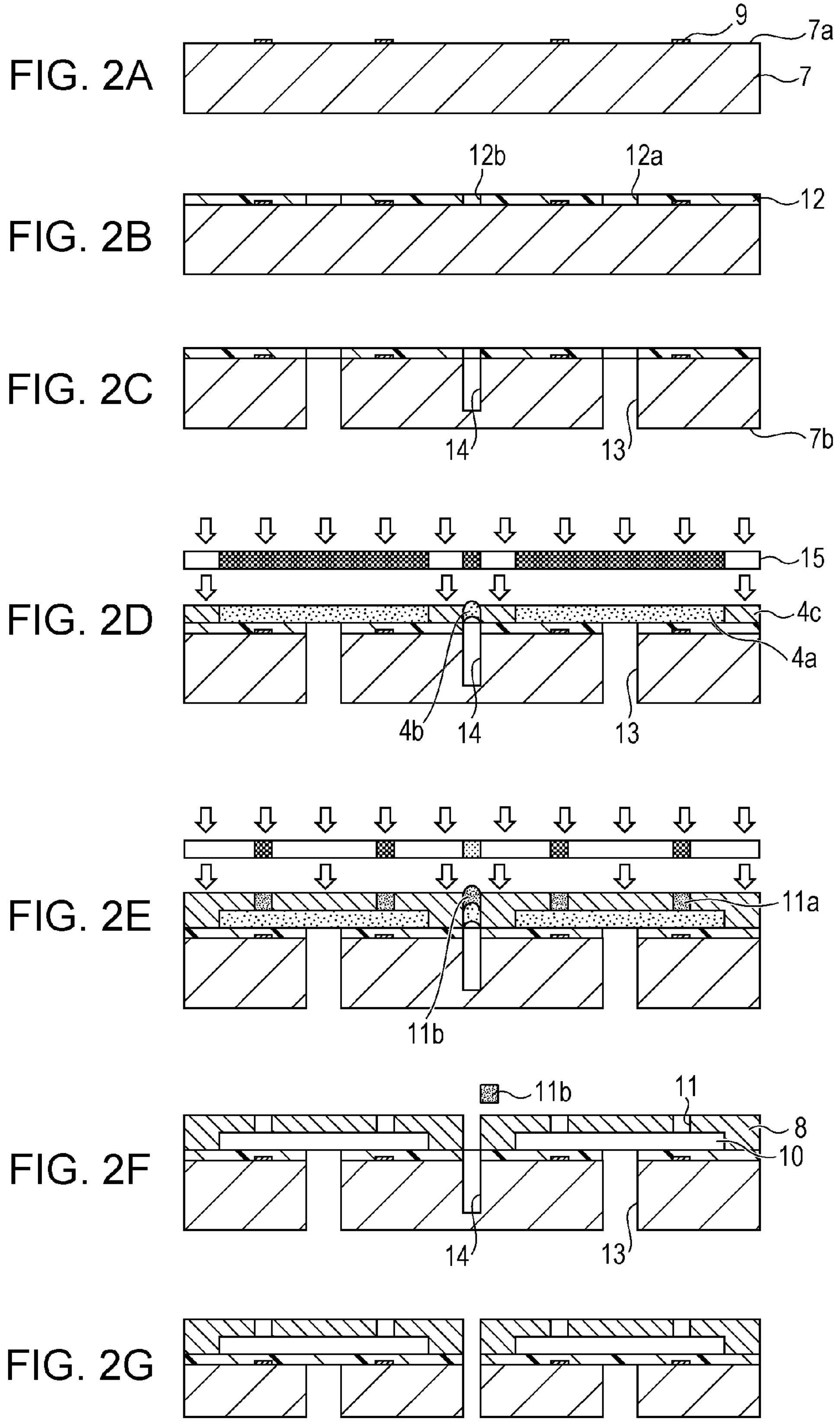
FIGS. 2A to 2G are drawings illustrating an example of a method of manufacturing the liquid discharge head of this disclosure.

First, as illustrated in FIG. 2A, the substrate 7 provided with the energy-generating element 9 on the front surface 7*a* side is prepared. At this moment, the substrate is not cut off from the wafer, and hence the substrate 7 is part of the wafer. The substrate 7 is preferably a silicon substrate formed of silicon. In this case, the wafer is a so-called silicon wafer. The silicon substrate preferably has a crystal orientation of (100) on the surface thereof. Alternatively, a silicon substrate having a crystal orientation of (110) on the surface thereof.

Subsequently, as illustrated in FIG. 2B, an etching mask layer 12 is formed on the front side of the wafer. The etching mask layer may be formed of any material as long as it is hardly disappeared by etching in comparison with the wafer and, for example, is formed of SiN, SiC, SiCN, $SiO_2$, or the like. The etching mask layer is provided with an opening 12*a* and an opening 12*b*. The etching mask layer may be used as a protective layer or an insulative layer that covers the energy generating element. In this manner, the necessity of removing the etching mask layer is eliminated. The protective layer and the insulative layer need not to be provided separately. The opening 12*a* and the opening 12*b* are formed, for example, by photolithography or reactive ion etching.

Subsequently, as illustrated in FIG. 2C, the wafer is processed from the opening 12*a* and the opening 12*b*, and a first hole 13 and a second hole 14 are formed from the front side of the wafer. The first hole 13 is formed from the opening 12*a* so as to penetrate through the wafer from the front surface 7*a* to the back surface 7*b*. The first hole 13 forms at least part of the liquid supply port. The second hole 14 is formed from the opening 12*b* and is not penetrated through the wafer. The second hole 14 forms at least part of a cut-off portion. The cut-off portion is a portion at a boundary along which the respective liquid discharge heads are cut off from the wafer. Examples of the method of forming the first hole and the second hole include reactive ion etching, wet etching, and a mechanical process. The first hole and the second hole may be formed using a combination of above-described methods. If the second hole 14 is formed to be a hole penetrating through the wafer at this time point, the liquid discharging head is easily separated from the wafer in the process of forming the flow passage forming member or in other processes, so that manufacture of the liquid discharge head with high degree of accuracy becomes difficult.

The first hole and the second hole may be formed in the same process. When the first hole and the second hole are formed by reactive ion etching, the opening area of the opening 12*a* is preferably larger than the opening area of the opening 12*b* in terms of the opening area of the opening in the direction parallel to the front surface of the substrate. With such a configuration, the processing speed in the opening 12*a* is increased when the reactive ion etching is performed simultaneously, and hence a relationship that the first hole 13 penetrates through the wafer and the second hole 14 does not penetrate through the wafer is easily achieved.

Although the second hole does not penetrate through the wafer, the depth thereof is preferably at least 50% of the thickness of the wafer, that is, the depth of the first hole. If the depth of the second hole is smaller than 50% of the thickness of the wafer, the amount of time required for grinding the wafer increases in later processes, and the manufacture of the liquid discharge head is affected. More preferably, the depth of the second hole is at least 60%, further preferably, at least 70% of the thickness of the wafer. In order to maintain the strength of the wafer at the time of the process, the depth of the second hole is preferably not larger than 95% of the depth of the first hole. If the depth of the second hole exceeds 95% of the depth of the first hole, the thickness of the remaining part of the wafer at the bottom of the second hole becomes extremely thin, and hence the strength of the wafer is lowered, and the substrate probably separates from the wafer. More preferably, the depth of the second hole is not larger than 90%, further preferably, not larger than 80%.

The first hole and the second hole each may be formed continuously, for example, in the longitudinal direction like a groove. Alternately, the first holes and the second holes may be formed discontinuously in the longitudinal direction. The same applies to the width direction. If holes are formed discontinuously, the holes may be connected later by etching.

Subsequently, as illustrated in FIG. 2D, a dry film is arranged on the front side of the wafer where the first hole 13 and the second hole 14 are formed on the front side of the wafer so as to close the first hole 13 and the second hole 14. Furthermore, the dry film is exposed by using a mask 15 and is heated (in the PEB process), a latent image pattern is formed on the dry film. In other words, heating of the dry film is performed in a state in which the first hole 13 has penetrated through the wafer. The dry film used here is a film in a dry state that is formed on a base material such as polyester. After the dry film has transferred to the wafer, the base material is removed. The dry film is preferably a photosensitive dry film. In particular, the dry film is preferably a dry film formed of a negative photosensitive resin. Examples of the material of the dry film include an epoxy resin.

A latent image pattern 4*a* on the dry film is a part that closes the first hole 13, and is a part finally removed to form the flow passage. A latent image pattern 4*b* is a part that closes the second hole 14, and is a part removed finally and located above the cut-off portion. A latent image pattern 4*c* is a part that becomes part of the flow passage forming member 8. When the dry film is heated in the PEB process, the latent image pattern 4*b* deforms as illustrated in FIG. 2D. This is caused by expansion of air in the second hole 14, which is a sealed space, located below the latent image pattern 4*b*. However, that part is located above the cut-off portion, and hence the expansion affects little on the shape of the flow passage forming member. In contrast, deformation occurs little on the latent image pattern 4*a*. This is because the first hole 13 located below the latent image pattern 4*a* penetrates through the wafer, and hence is not a sealed space, so that air may be released therefrom. Since a hole is substantially not formed below the latent image pattern 4*c*, the latent image pattern 4*c* is little subjected to deformation.

Part of the latent image pattern 4*b*, in other words, part of the dry film which closes the second hole 14 is preferably not cured by exposure. In the case where the dry film is a dry film of negative type, the part of the dry film that closes the second hole 14 is preferably masked so as not to be exposed. If the part of the dry film that closes the second hole 14 is cured, deformation may affect the flow passage forming member in some cases.

Subsequently, as illustrated in FIG. 2E, a discharge port forming member is formed on the dry film. The discharge port forming member forms part of the flow passage, that is, an upper wall of the flow passage in FIG. 2E. In other words, the discharge port forming member in FIG. 2E is part of the flow passage forming member. In FIG. 2E, the latent image pattern 4*a* remains without being developed (removed), and the discharge port forming member is formed thereon. However, the discharge port forming member may be formed after the latent image pattern 4*a* is developed. A latent image pattern 11*a* is formed on the discharge port forming member by, for example, exposure. The latent image pattern 11*a* is a part where a latent image of the shape of the discharge port is formed.

The discharge port forming member is preferably formed of a resin, and more preferably, formed of a photosensitive resin. The discharge port forming member may be formed by spin coating or direct coating, or may be stacked as a dry film on the dry film located below. When exposing the discharge port forming member, the sensitivity of the dry film located below and that of the discharge port forming member need to be differentiated. In this case, the discharge port forming member is preferably formed of a dry film. Although the mode in which a discharge port forming member is further formed has been described, a flow passage forming member having a flow passage and a discharge port formed only with a single dry film is also applicable.

When the discharge port forming member is heated, a deformed portion 11*b* is formed. The deformed portion 11*b* is located above the second hole 14, and is formed with deformation due to the expansion of air in the second hole 14 or deformation of the latent image pattern 4*b*. The deformed portion 11*b* is located above the cut-off portion, and hence affects little the shape of the flow passage forming member.

Subsequently, as illustrated in FIG. 2F, the latent image pattern 4*a*, the latent image pattern 4*b*, the latent image pattern 11*a*, and the deformed portion 11*b* are removed. Accordingly, the flow passage 10 and the liquid discharge port 11 are formed on the flow passage forming member 8. Here, the example in which the latent image pattern 4*a*, the latent image pattern 4*b*, the latent image pattern 11*a*, and the deformed portion 11*b* are removed simultaneously has been described. However, the latent image pattern 4*a*, the latent image pattern 4*b*, the latent image pattern 11*a*, and the deformed portion 11*b* may be removed separately. Alternatively, when the liquid discharge port 11 is formed not by exposure or development, but by reactive ion etching or laser irradiation, removal of the discharge port pattern is not necessary.

In this stage as well, the first hole 13 penetrates through the wafer, but the second hole 14 does not penetrate through the wafer. Subsequently, as illustrated in FIG. 2G, the wafer is ground from the back side so as to cause the second hole 14 to penetrate through the wafer. Examples of a method of grinding include mechanical grinding (CMP) or reactive ion etching.

When the second hole 14 penetrates through the wafer, a portion including the second hole becomes the cut-off portion, so that the liquid discharge head is allowed to be cut off from the wafer at this portion. Simultaneously, the first hole 13 becomes the liquid supply port 6. In FIG. 2G, the state in which two liquid discharge heads are formed is illustrated.

As described above, according to this disclosure, deformation of the flow passage forming member due to the expansion of air in the sealed space is restricted, and the liquid discharge head having the flow passage forming member with high degree of accuracy is manufactured.

EXAMPLES

This disclosure will be described below further in detail by using the examples.

Example 1

First, as illustrated in FIG. 2A, the substrate (wafer) 7 provided with the energy-generating element 9 on the front surface 7*a* side was prepared. The energy-generating element was made of TaSiN, and a substrate, which was a silicon substrate, having a crystal orientation of (100) was used as the substrate. The thickness of the substrate was 700 m. Films of $SiO_2$ and SiN were formed on the energy-generating element by plasma CVD, and the formed film was used as an insulating protection layer.

Subsequently, as illustrated in FIG. 2B, the etching mask layer 12 was formed. The etching mask layer 12 was formed by using a resin (product name: THMR-iP5700 HP, manufactured by TOKYO OHKA KOGYO CO., LTD), so as to have a thickness of 10 m. Subsequently, the opening 12*a* and the opening 12*b* were formed by photolithography process. The opening width of the opening 12*a* was 100 m, and the opening width of the opening 12*b* was 40 m in terms of the direction parallel to the front surface of the substrate. The opening area of the opening 12*a* was 10000 $m^2$, and the opening area of the opening 12*b* was 1600 $m^2$ in terms of the direction parallel to the front surface of the substrate.

Subsequently, as illustrated in FIG. 2C, the wafer was processed by reactive ion etching from the opening 12*a* and the opening 12*b*, and the first hole 13 and the second hole 14 were formed from the front side of the wafer. Bosch process was employed as the reactive ion etching, and the difference in etching rate depending on the opening area was utilized, whereby the first hole 13 penetrating through the wafer and the second hole 14 which does not penetrate through the wafer were formed simultaneously. The depth of the first hole 13 was 700 m, which was the same as the thickness of the wafer, and the depth of the second hole was 560 m.

Subsequently, as illustrated in FIG. 2D, a dry film was arranged on the front side of the wafer where the first hole 13 and the second hole 14 were formed so as to close the first hole 13 and the second hole 14 on the front side of the wafer. A negative photosensitive dry film containing an epoxy resin was used as the dry film. Furthermore, by exposing the dry film by using the mask 15 and heating (PEB process) the same, a latent image pattern was formed on the dry film. The exposure was conducted under the conditions of an amount of exposure of 6000 $J/m^2$, and heating at 50° C. for 5 minutes.

Subsequently, as illustrated in FIG. 2E, the discharge port forming member was formed on the dry film. A negative photosensitive dry film containing an epoxy resin was used as the discharge port forming member. The discharge port forming member was exposed and heated (PEB process), so that the latent image pattern 11*a* was formed on the dry film. The exposure was conducted under the conditions of an amount of exposure of 2000 J/$m^2$, and heating at 90° C. for 4 minutes. At the time of heating (PEB), the first hole 13 was in the state of penetrating through the wafer.

Subsequently, as illustrated in FIG. 2F, the latent image pattern 4*a*, the latent image pattern 4*b*, the latent image pattern 11*a*, and the deformed portion 11*b* were removed by melting with propyleneglycol monomethylether acetate to form the flow passage 10 and the liquid discharge port 11 in the flow passage forming member 8.

Finally, as illustrated in FIG. 2G, the wafer is ground by 150 m from the back side by CMP so as to cause the second hole 14 to penetrate through the wafer. The portion including the portion in which the second hole 14 penetrates through the wafer was used as the cut-off portion, and the liquid discharge head was cut off from the wafer at this portion.

The liquid discharge head was manufactured in the manner described above. The manufactured liquid discharge head was provided with the flow passage forming member formed with high degree of accuracy.

Example 2

In Example 1, the first hole 13 and the second hole 14 were formed by reactive ion etching as illustrated in FIG. 2C. In Example 2, the first hole 13 and the second hole 14 were formed by laser irradiation and wet etching instead of the procedure illustrated in FIG. 2C. Description on parts which are the same as those of Example 1 were herein omitted.

Figure 3A:
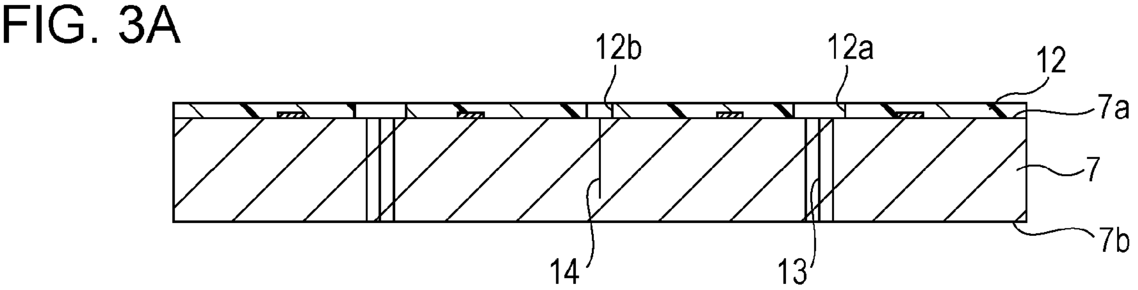
FIGS. 3A and 3B are drawings illustrating an example of the method of manufacturing a liquid discharge head of this disclosure.

As illustrated in FIG. 3A, the substrate 7 was irradiated with a laser from the opening 12*a* and the opening 12*b*, and the first hole 13 and the second hole 14 were formed in the substrate 7. The irradiation with laser was performed using a third harmonic (wavelength: 355 nm) of YAG laser at an output of 10 W and a frequency of 100 KHz. The first hole 13 was caused to penetrate through the wafer, and the second hole 14 was not caused to penetrate through the wafer. A plurality of the first holes 13 were formed within the openings 12*a*, and one second hole 14 was formed in the opening 12*b*.

Figure 3B:
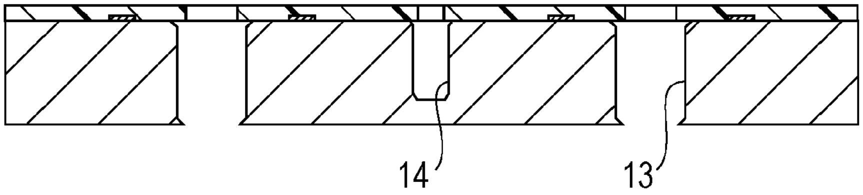

Subsequently, as illustrated in FIG. 3B, the wafer was subjected to wet etching with tetra-methyl-ammonium-hydride (TMAH) having 22 mass % solution. The etching conditions were as follows; an etching temperature of 83° C., and an etching time of 2 hours. Even after the wet etching, the first holes 13 penetrated through the wafer, and the second hole 14 did not penetrated through the wafer.

In the same manner as Example 1 except for the points described above, the liquid discharge head was manufactured. The manufactured liquid discharge head was provided with the flow passage forming member formed with high degree of accuracy.

According to this disclosure, even when the hole for the supply port and the hole for the cut-off portion are formed from the front side of the wafer, and then the flow passage forming member is formed on the front side of the wafer by the dry film to heat and develop the same, the flow passage forming member may be formed with high degree of accuracy.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-136151, filed Jun. 28, 2013, which is hereby incorporated by reference herein in its entirety.

What is claimed is:

1. A method of manufacturing a liquid discharge head including a substrate having a liquid supply port and a flow passage forming member on a front side of the substrate, and configured to be manufactured by being cut off from a wafer at a cut-off portion, the method comprising:

forming a first hole which penetrates through a wafer and becomes at least part of the liquid supply port and a second hole which does not penetrate through the wafer and becomes at least part of the cut-off portion in the wafer from a front side of the wafer;

arranging a dry film on the front side of the wafer so as to close the first hole and the second hole on the front side;

forming the flow passage forming member from the dry film by heating and developing the dry film in a state in which the first hole penetrates through the wafer; and cutting off the liquid discharge head from the wafer by grinding the wafer from a back side which is a side opposite to the front side so that the second hole penetrates through the wafer.

2. The method of manufacturing a liquid discharge head according to claim 1, wherein the first hole and the second hole are formed from an opening in an etching mask formed on the front side of the wafer, the substrate includes an energy-generating element, and the etching mask covers the energy-generating element.

3. The method of manufacturing a liquid discharge head according to claim 1, wherein the wafer is a silicon wafer formed of silicon.

4. The method of manufacturing a liquid discharge head according to claim 1, wherein the dry film is a negative photosensitive dry film.

5. The method of manufacturing a liquid discharge head according to claim 4, wherein part of the dry film that closes the second hole is not exposed.

6. The method of manufacturing a liquid discharge head according to claim 1, wherein the depth of the second hole falls within a range from 50% to 95% of the depth of the first hole.

7. The method of manufacturing a liquid discharge head according to claim 1, wherein the first hole and the second hole are formed from an opening in an etching mask formed on the front side of the wafer, the etching mask has an opening for forming the first hole and an opening for forming the second hole, the opening area of the opening for forming the first hole in the direction parallel to the front surface of the substrate is larger than the opening area of the opening for forming the second hole in the direction parallel to the front surface of the substrate.

8. The method of manufacturing a liquid discharge head according to claim 1, wherein the formation of the first hole and the second hole is performed by reactive ion etching.

9. The method of manufacturing a liquid discharge head according to claim 1, wherein the formation of the first hole and the second hole is performed by wet etching.

* * * * *